United States Patent
Yueh et al.

(10) Patent No.: US 10,993,347 B2
(45) Date of Patent: Apr. 27, 2021

(54) ELECTRONIC DEVICE AND TILED ELECTRONIC SYSTEM COMPRISING THE SAME

(71) Applicant: InnoLux Corporation, Miao-Li County (TW)

(72) Inventors: Jui-Jen Yueh, Miao-Li County (TW); Kuan-Feng Lee, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 16/196,660

(22) Filed: Nov. 20, 2018

(65) Prior Publication Data

US 2020/0163246 A1 May 21, 2020

(51) Int. Cl.
*H05K 7/14* (2006.01)
*G09G 3/32* (2016.01)

(52) U.S. Cl.
CPC ............. *H05K 7/1451* (2013.01); *G09G 3/32* (2013.01); *H05K 7/1452* (2013.01); *G09G 2300/026* (2013.01)

(58) Field of Classification Search
CPC ........................... H05K 7/1451; H05K 7/1452
USPC .............. 361/760, 767, 792–795, 816, 818
See application file for complete search history.

(56) References Cited

U.S. PATENT DOCUMENTS

| | | | | |
|---|---|---|---|---|
| 4,882,454 A | * | 11/1989 | Peterson | H05K 1/0206 174/252 |
| 5,428,885 A | * | 7/1995 | Takaya | H01L 25/16 29/25.42 |
| 5,586,011 A | * | 12/1996 | Alexander | H05K 1/0218 174/355 |
| 5,949,654 A | * | 9/1999 | Fukuoka | H01L 21/50 257/700 |
| 7,613,009 B2 | * | 11/2009 | Young | H01L 23/66 361/763 |
| 8,388,162 B2 | * | 3/2013 | Park | G02F 1/133603 362/249.02 |
| 9,059,339 B1 | * | 6/2015 | Bayram | H01L 33/0079 |
| 2002/0071265 A1 | * | 6/2002 | Centola | H05K 9/0039 361/818 |
| 2005/0184381 A1 | * | 8/2005 | Asahi | H05K 1/141 257/693 |
| 2008/0031295 A1 | * | 2/2008 | Tanaka | H01S 5/04257 372/44.01 |
| 2008/0308305 A1 | * | 12/2008 | Kawabe | H05K 1/0271 174/255 |
| 2010/0237759 A1 | * | 9/2010 | Shibukawa | H01J 11/18 313/1 |
| 2017/0010638 A1 | * | 1/2017 | Park | G09G 3/2092 |
| 2017/0017108 A1 | | 1/2017 | Shin et al. | |

(Continued)

*Primary Examiner* — Tuan T Dinh

(74) *Attorney, Agent, or Firm* — Muncy, Geissler, Olds & Lowe, P.C.

(57) ABSTRACT

An electronic device used for coupling to another electronic device in a side by side manner is disclosed, which includes: a first substrate having a first top surface and a first side surface connecting to the first top surface; a first signal line formed on the first top surface; a plurality of first electronic elements electrically connected to the first signal line; and a first conductive pattern formed on the first top surface and the first side surface, and electrically connected to the first signal line. In addition, a tiled electronic system includes the aforesaid electronic device is also disclosed.

15 Claims, 6 Drawing Sheets

(56) References Cited

U.S. PATENT DOCUMENTS

| | | | |
|---|---|---|---|
| 2017/0148374 A1* | 5/2017 | Lee | G09G 3/2092 |
| 2017/0220310 A1* | 8/2017 | Hochman | G06F 3/1446 |
| 2017/0358602 A1 | 12/2017 | Bae et al. | |
| 2018/0190631 A1* | 7/2018 | Kim | G02F 1/13452 |
| 2019/0155085 A1* | 5/2019 | Kim | G02F 1/13452 |

* cited by examiner

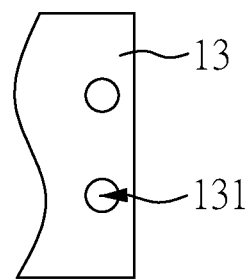
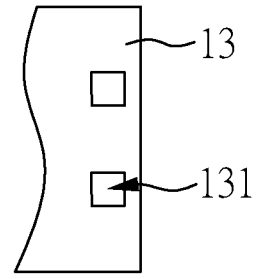
FIG. 3A     FIG. 3B
FIG. 4A     FIG. 4D
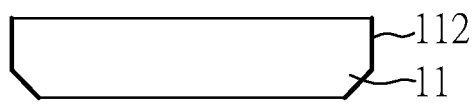
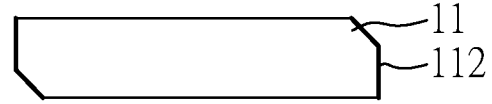
FIG. 4B     FIG. 4E
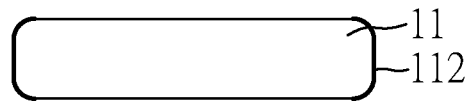
FIG. 4C     FIG. 4F

ELECTRONIC DEVICE AND TILED ELECTRONIC SYSTEM COMPRISING THE SAME

BACKGROUND

1. Field

The present disclosure relates to an electronic device and a tiled electronic system comprising the same.

2. Description of Related Art

With the continuous advancement of technologies related to display devices, the applications of the display devices are not limited to monitors, mobile phones, laptops, televisions, etc. Nowadays, tiled display systems are developed to extend the applications of the display devices to video walls, advertising boards, and other electronic devices for displaying large images.

Except for the tiled display system, tiled antenna systems or tiled sensing systems are also developed to make, for example, the walls of buildings, have antenna or sensing functions.

In all the electronic devices illustrated above, a multi-layered circuit board is usually used to electrically connect the elements on two opposite sides of the multi-layered circuit board, but the cost of the multi-layered circuit board is high. If a transistor substrate is used to replace the multi-layered circuit board, it is difficult to form circuits in the transistor substrate to electrically connect the elements on two opposite sides of the transistor substrate.

Thus, it is desirable to provide an electronic device in which the elements on two opposite sides of the transistor substrate can be easily connected to each other and a tiled electronic system comprising the same.

SUMMARY

The present disclosure provides an electronic device used for coupling to another electronic device in a side by side manner, comprising: a first substrate having a first top surface and a first side surface connecting to the first top surface; a first signal line formed on the first top surface; a plurality of first electronic elements electrically connected to the first signal line; and a first conductive pattern formed on the first top surface and the first side surface, and electrically connected to the first signal line.

The present disclosure also provides a tiled electronic system, comprising: a first electronic device and a second electronic device disposed adjacent to the first electronic device. The first electronic device comprises: a first substrate having a first top surface and a first side surface connecting to the first top surface; a first signal line formed on the first top surface; a plurality of first electronic elements electrically connected to the first signal line; and a first conductive pattern formed on the first top surface and the first side surface, and electrically connected to the first signal line. The second electronic device comprises: a second substrate having a second top surface and a second side surface connecting to the second top surface; a second signal line formed on the second top surface; a plurality of second electronic elements electrically connected to the second signal line; and a second conductive pattern formed on the second top surface and the second side surface, and electrically connected to the second signal line. In addition, the first electronic device is electrically connected to the second electronic device through a connecting element.

Other novel features of the disclosure will become more apparent from the following detailed description when taken in conjunction with the accompanying drawings.

BRIEF DESCRIPTION OF THE DRAWINGS

FIG. 3A and FIG. 3B are top views showing vias of an insulating layer in an electronic device according to different aspects of the present disclosure.

FIG. 4A to FIG. 4F are cross-sectional views showing a shape of a first substrate in an electronic device according to different aspects of the present disclosure.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

Furthermore, the terms recited in the specification and the claims such as "connect" is intended not only directly connect with other element, but also intended indirectly connect and electrically connect with other element.

In addition, the features in different embodiments of the present disclosure can be mixed to form another embodiment.

Embodiment 1

Figure 1:
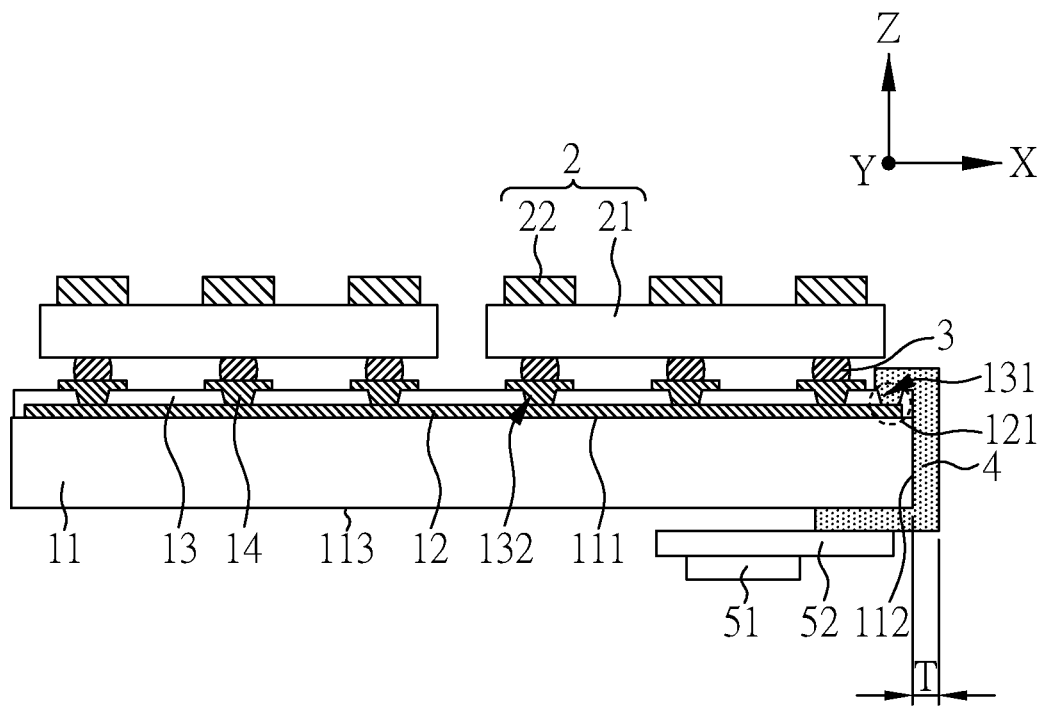
FIG. 1 is a cross-sectional view of an electronic device according to Embodiment 1 of the present disclosure.
Figure 2:
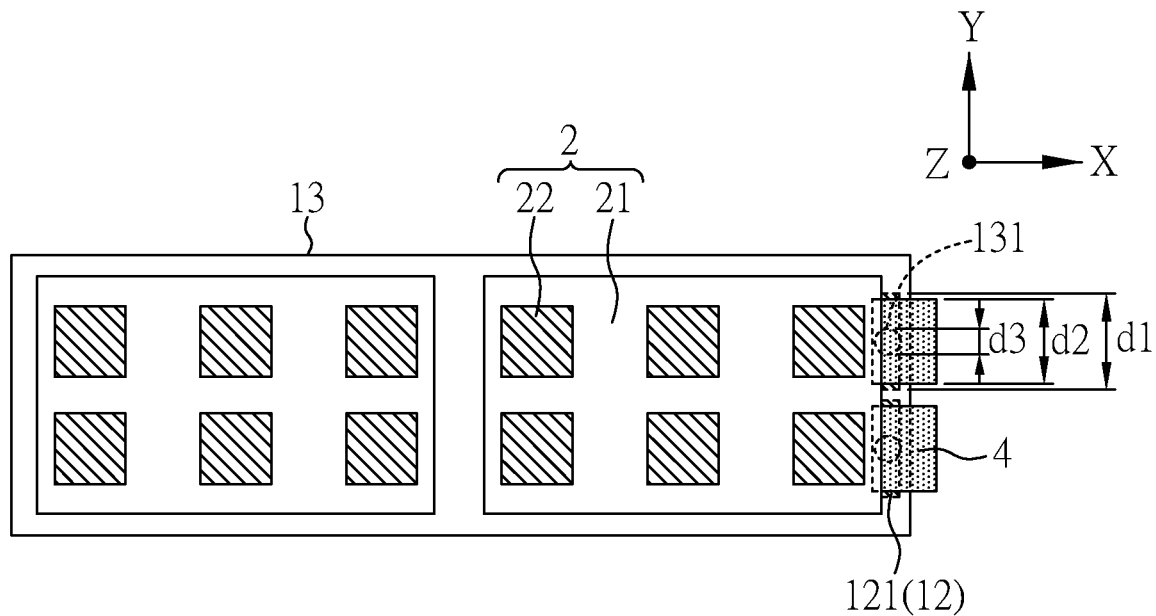
FIG. 2 is a top view of an electronic device according to Embodiment 1 of the present disclosure.

FIG. 1 and FIG. 2 are respectively a cross-sectional view and a top view of an electronic device of the present embodiment. The electronic device of the present embodiment can be used for coupling to another electronic device in a side by side manner.

As shown in FIG. 1, the electronic device of the present embodiment comprises: a first substrate 11 having a first top surface 111 and a first side surface 112 connecting to the first top surface 111; a first signal line 12 formed on the first top surface 111; a plurality of first electronic elements 22 electrically connected to the first signal line 12; and a first conductive pattern 4 formed on the first top surface 111 and the first side surface 112, and electrically connected to the first signal line 12.

In the present embodiment, the first substrate 11 can be a substrate comprising active elements. For example, the first substrate 11 can be a transistor substrate. In addition, the first substrate 11 may comprise a quartz substrate, a glass substrate, a wafer, a sapphire substrate, or etc. Alternatively, the first substrate 11 may comprise a flexible substrate or a film, and the material of which can comprise polycarbonate (PC), polyimide (PI), polypropylene (PP), polyethylene terephthalate (PET), or other plastic or polymer material. However, the present disclosure is not limited thereto.

The first substrate 11 has a first top surface 111 and a first side surface 112, and the first top surface 111 is neighboring to and connected to the first side surface 112. In addition, the first substrate 11 further has a first bottom surface 113 opposite to the first top surface 111, and the first bottom surface 113 is also neighboring to and connected to the first side surface 112. Thus, the first side surface 112 is a surface connecting the first top surface 111 and the first bottom surface 113.

In the present embodiment, the first signal line 12 is formed on the first top surface 111. In addition, an insulating layer 13 is formed on the first signal line 12, and the insulating layer 13 has a via 131 to expose a pad 121 of the first signal line 12. In addition, the insulating layer 13 may also have a plurality of contact vias 132, and a plurality of contact pads 14 are respectively disposed in the contact vias 132 to electrically connect to the first signal line 12. Herein, the material of the first signal line 12 or the material of the contact pads 14 may comprise, for example, Cu, Al, Mo, W, Au, Cr, Ni, Pt, Ti, Cu alloy, Al alloy, Mo alloy, W alloy, Au alloy, Cr alloy, Ni alloy, Pt alloy, Ti alloy, other suitable metal, a combination thereof, or other conductive material with good conductivity or small resistance, but the present disclosure is not limited thereto. In addition, the material of the insulating layer 13 may comprise, for example, silicon oxide, silicon oxynitride, silicon nitride, aluminum oxide, resin, polymer, photoresist, or a combination thereof, but the present disclosure is not limited thereto. In the present embodiment, the first signal line 12 can be formed by a sputtering process and then a lithography process, and the insulating layer 13 can be formed by a deposition process or a coating process and then a lithography process, but the present disclosure is not limited thereto.

In the present embodiment, a first conductive pattern 4 is formed on the first top surface 111 and the first side surface 112, and electrically connected to the first signal line 12. More specifically, the first conductive pattern 4 is electrically connected to the first signal line 12 through the via 131 of the insulating layer 13. In addition, in the present embodiment, the first conductive pattern 4 is further formed on the first bottom surface 113 opposite to the first top surface 111 of the first substrate 11. Furthermore, a thickness T of the first conductive pattern 4 at the first side surface 112 may be in a range from 5 μm to 20 μm (5 μm≤T≤20 μm). However, the present disclosure is not limited thereto, and the thickness T of the first conductive pattern 4 can be adjusted according to the need. Because the thickness T of the first conductive pattern 4 at the first side surface 112 is thin in the present embodiment, an electronic device with narrow bezel can be obtained. In addition, because the thickness T of the first conductive pattern 4 is thin, the electronic device of the present embodiment can be used for coupling to another electronic device in a side by side manner to obtain a tiled electronic system, and the gap between two electronic devices can be greatly reduced.

Herein, the first conductive pattern 4 can be formed by a printing process, such as an inject printing process, a screen printing process, a pad printing process, or other suitable process. The first conductive pattern 4 can be formed by conductive ink or conductive paste, but the present disclosure is not limited thereto.

In the present embodiment, the first signal line 12 may further comprise a pad 121, and the first conductive pattern 4 is electrically connected to the pad 121 through the via 131 of insulating layer 13. In particular, as shown in FIG. 2, the first conductive pattern 4 is at least partially overlapped with the pad 121 of the first signal line 12 in view of a normal direction (Z) of the first substrate 11. Herein, the pad 121 of the first signal line 12 has a first width d1 along a first direction (Y), the first conductive pattern 4 has a second width d2 along the first direction (Y), and the first width d1 is greater than the second width d2. In addition, the via 131 has a third width d3 along the first direction (Y), and the second width d2 is greater than the third width d3.

The pad 121 of the first signal line 12 is formed by patterning a metal layer with a lithography process, so the first width d1 of the pad 121 of the first signal line 12 can be accurately controlled. On the other hand, the first conductive pattern 4 is formed by a printing process, and the second width d2 of the first conductive pattern 4 may be greater than expected. Thus, the second width d2 of the first conductive pattern 4 has to be as short as possible to prevent two adjacent first conductive patterns 4 connected to each other, resulting in the short circuit. Hence, in the present embodiment, the first width d1 of pad 121 of the first signal line 12 is designed to be greater than the second width d2 of the first conductive pattern 4. However, if the second width d2 is too short, the electrical connection between the first conductive pattern 4 and the pad 121 of the first signal line 12 may be not good enough. Thus, the second width d2 of the first conductive pattern 4 is designed to be greater than the third width d3 of the via 131 of the insulating layer 13.

In the present embodiment, the electronic device may further comprise a first circuit board 52 electrically connected to the first conductive pattern 4 at the first bottom surface 113. In addition, the electronic device may further comprise a driving element 51 electrically connected to the first circuit board 52 and disposed at the first bottom surface 113 of the first substrate 11. In the present embodiment, the first circuit board 52 may comprise a flexible printed circuit board or a printed circuit board. The driving element 51 may comprise an integrated circuit, but the present disclosure is not limited thereto. In other embodiments, the electronic device may further comprise a wireless module electrically connected to the first circuit board 52.

The electronic device of the present embodiment further comprises: a plurality of first electronic elements 22 disposed on the first top surface 111 and electrically connected to the first signal line 12. More specifically, the electronic device of the present embodiment further comprises at least one electronic module 2, which comprises a circuit carrier 21 and a plurality of first electronic elements 22 disposed on the circuit carrier 21. Herein, the circuit carrier 21 is a substrate without active elements, but may have circuits electrically connected to the first electronic elements 22. In the present embodiment, the circuit carrier 21 have circuits to electrically connect the first electronic elements 22 disposed on the upper side of the circuit carrier 21 and conductive units 3 disposed on the bottom side of the circuit carrier 21; but the present disclosure is not limited thereto. Herein, the number of the first electronic elements 22 is the same as the number of the conductive units 3, but the present disclosure is not limited thereto. In another embodiment of the present disclosure, the number of the first electronic elements 22 can be different from the number of the conductive units 3.

The circuit carrier 21 may comprise a quartz substrate, a glass substrate, a wafer, a sapphire substrate, or etc. Alternatively, the circuit carrier 21 may comprise a flexible substrate or a film, and the material of which can comprise PC, PI, PP, PET, or other plastic or polymer material. Alternatively, the circuit carrier 21 may comprise at least one active element such as CMOS, PMOS, NMOS transistor, or a combination thereof. Alternatively, the circuit carrier 21 may comprise a circuit board, or a plate made of a molding material. However, the present disclosure is not limited thereto. The conductive units 3 may respectively be a solder bump, a metal pillar, or a conductive particle. The conductive units 3 may respectively comprise Ag, Al, Ni, Cr, Cu, Au, Pd, Pt, Sn, W, Rh, Ir, Ru, Mg, Zn, or an alloy thereof, but the present disclosure is not limited thereto.

In the present embodiment, the electronic module 2 is mounted on the first substrate 11 through the conductive units 3, and the first electronic elements 22 are electrically connected to the first signal line 12 through the circuit carrier 21 with circuits, the conductive units 3 and the contact pads 14 disposed on the first signal line 12. Thus, when the driving element 51 provides a driving signal, the driving signal can sequentially transmitted to the first circuit board 52, the first conductive pattern 4, the first signal line 12, the contact pads 14, the conductive units 3, the circuit carrier 21 with circuits and the first electronic elements 22 to drive the first electronic elements 22.

In the present embodiment, the first conductive pattern 4 is formed on the first top surface 111, the first side surface 112 and the first bottom surface 113 of the first substrate 11 which is a transistor substrate and electrically connected to the first signal line 12 through the via 131 of the insulating layer 13, so the first electronic elements 22 disposed on the first top surface 111 can be electrically connect to the driving element 51 on the first bottom surface 113 through the first conductive pattern 4.

FIG. 3A and FIG. 3B are top views showing vias of an insulating layer in different aspects of the present disclosure. In the aspect shown in FIG. 3A, the vias 131 of the insulating layer 13 have circular shapes. In another aspect shown in FIG. 3B, the vias 131 of the insulating layer 13 have rectangle shapes. However, the shapes of the vias 131 of the insulating layer 13 are not limited thereto, and may be polygons or irregular shapes. In addition, in the aspects shown in FIG. 3A and FIG. 3B, the vias 131 of the insulating layer 13 are enclosed vias.

As shown in FIG. 1, the first side surface 112 is perpendicular to the first top surface 111 and the first bottom surface 113, but the present disclosure is not limited to. FIG. 4A to FIG. 4F are cross-sectional views showing a shape of a first substrate in different aspects of the present disclosure, wherein the first side surfaces 112 are indicated by thick lines. However, the shape of the first substrate 11 is not limited to those shown in FIG. 1 and FIG. 4A to FIG. 4F.

Furthermore, in the present embodiment, each of the first electronic elements 22 can respectively be a light emitting diode, an antenna unit or a sensor. Thus, the electronic device of the present embodiment may be a display device, a sensing device, an antenna device or a combination thereof. Herein, the light emitting diode can be inorganic light-emitting diodes (LEDs), mini light-emitting diodes (mini-LEDs), micro light-emitting diodes (micro-LEDs) or quantum-dot light-emitting diodes (QLEDs); but the present disclosure is not limited thereto.

Embodiment 2

Figure 5:
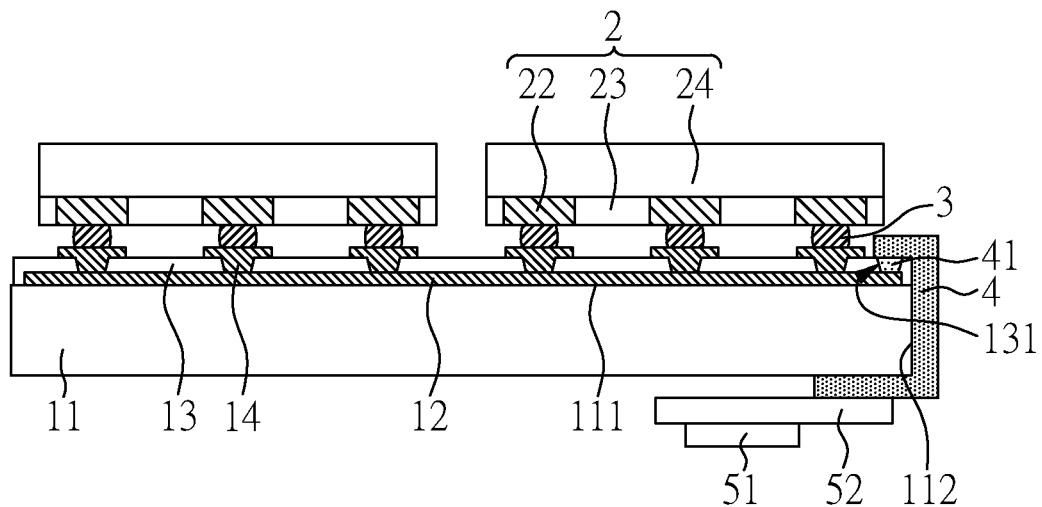
FIG. 5 is a cross-sectional view of an electronic device according to Embodiment 2 of the present disclosure.

FIG. 5 is a cross-sectional view of an electronic device of the present embodiment. The electronic device of the present embodiment is similar to that shown in Embodiment 1, except for the following differences.

In the present embodiment, the electronic device further comprises a conductive element 41 disposed in the via 131 of the insulating layer 13, wherein the first conductive pattern 4 is electrically connected to the first signal line 12 through the conductive element 41. The material of the conductive element 41 can be similar to the conductive units 3, the contact pads 14 or the first conductive pattern 4; but the present disclosure is not limited thereto.

In addition, in the present embodiment, the electronic module 2 comprises a growth substrate 24; a plurality of first electronic elements 22 disposed on a side of the growth substrate 24; and an insulating layer 23 disposed on the side of the growth substrate 24 and between the first electronic elements 22. Herein, the first electronic elements 22 can be LEDs, mini-LEDs, micro-LEDs or QLEDs, and the growth substrate 24 is a substrate for the first electronic elements 22 grown thereon. Examples of the growth substrate 24 may comprise, but are not limited to, a sapphire substrate, a silicon wafer, a SiC substrate, a SiGe substrate or a GaN substrate. The material of the insulating layer 23 can be similar to the material of the insulating layer 13 illustrated above, and are not repeated again.

Thus, in the present embodiment, when the driving element 51 provides a driving signal, the driving signal can sequentially transmitted to the first circuit board 52, the first conductive pattern 4, the conductive element 41, the first signal line 12, the contact pads 14, the conductive units 3 and the first electronic elements 22 to drive the first electronic elements 22.

Embodiment 3

Figure 6:
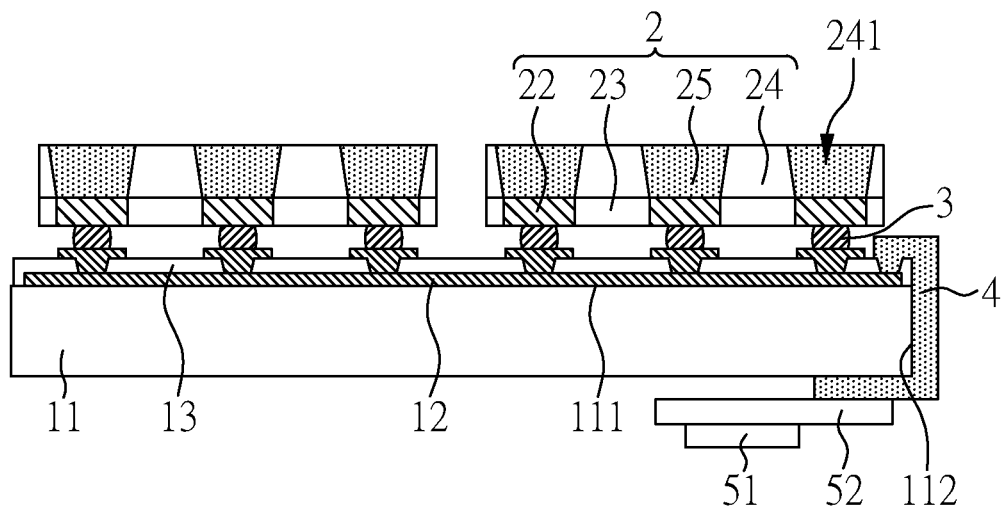
FIG. 6 is a cross-sectional view of an electronic device according to Embodiment 3 of the present disclosure.

FIG. 6 is a cross-sectional view of an electronic device of the present embodiment. The electronic device of the present embodiment is similar to that shown in Embodiment 2, except for the following differences.

In the present embodiment, the growth substrate 24 comprises a via 241 corresponding to the first electronic element 22. In addition, the electronic module 2 further comprises a light conversion layer 25 disposed in the via 241 of the growth substrate 24. Thus, the light emitting from the first electronic element 22 can be converted into light with desirable wavelength by the light conversion layer 25. In the present embodiment, the light conversion layer 25 can be a quantum dot layer, a phosphor powder layer, a fluorescent powder layer, or a combination thereof, but the present disclosure is not limited thereto.

In addition, the electronic device of the present embodiment does not comprise the conductive element 41 shown in FIG. 5.

Embodiment 4

Figure 7:
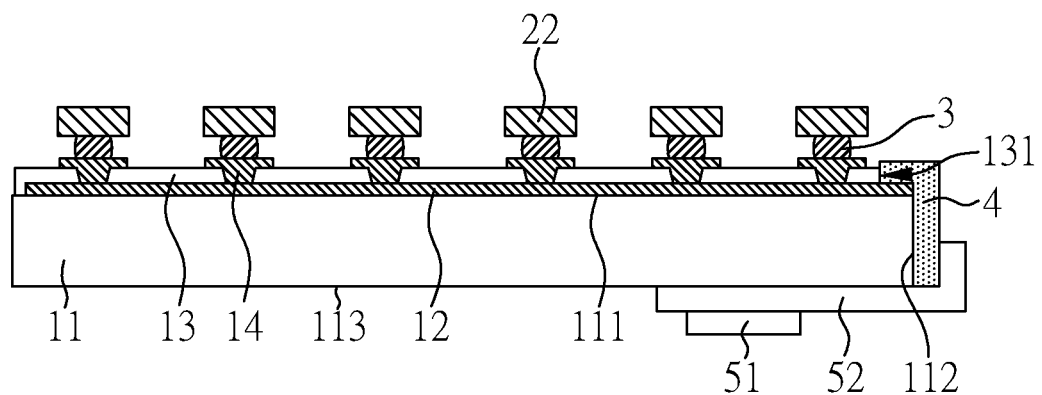
FIG. 7 is a cross-sectional view of an electronic device according to Embodiment 4 of the present disclosure.

FIG. 7 is a cross-sectional view of an electronic device of the present embodiment. The electronic device of the present embodiment is similar to that shown in Embodiment 1, except for the following differences.

In the present embodiment, the via 131 of the insulating layer 13 is a non-enclosed via.

Figures 8A, 8B:
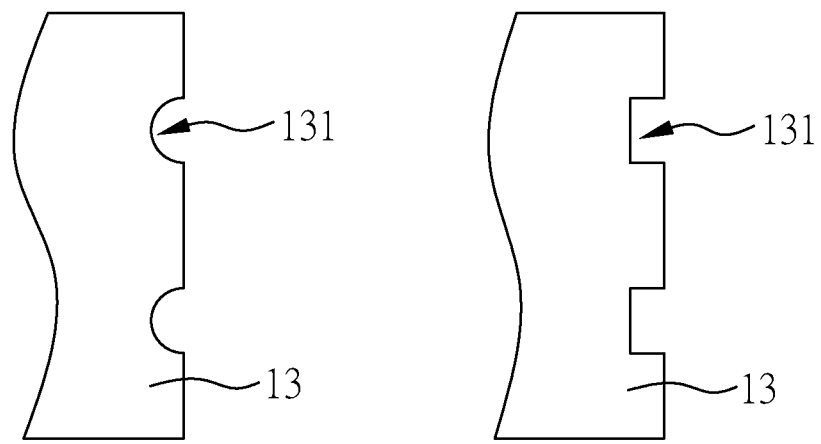
FIG. 8A and FIG. 8B are top views showing vias of an insulating layer in an electronic device according to different aspects of the present disclosure.

FIG. 8A and FIG. 8B are top views showing vias of an insulating layer in different aspects of the present disclosure. In the aspect shown in FIG. 8A, the vias 131 of the insulating layer 13 are non-enclosed vias and have semi-circular shapes. In another aspect shown in FIG. 8B, the vias 131 of the insulating layer 13 have rectangle shapes. However, the shapes of the vias 131 of the insulating layer 13 are not limited thereto, and may be polygons or irregular shapes.

In addition, as shown in FIG. 7, the first conductive pattern 4 in the electronic device of the present embodiment is not disposed on the first bottom surface 113 of the first substrate 11, and is only disposed on the first top surface 111 and the first side surface 112 of the first substrate 11. Thus, the first circuit board 52 is electrically connected to the first conductive pattern 4 at the first side surface 112.

Furthermore, in the present embodiment, the first electronic elements 22 are directly mounted on the first substrate 11 through the conductive units 3, and the first electronic elements 22 are electrically connected to the first signal line 12 through the conductive units 3 and the contact pads 14 disposed on the first signal line 12.

In the above embodiments, the via 131 is only disposed at one side of the insulating layer 13. In another embodiment of the present disclosure, if the insulating layer 13 has a plurality of vias 131, the vias 131 can be disposed at one or more sides of the insulating layer 13.

In addition, in the above embodiments, the via 131 is not overlapped with the electronic module 2 or the first electronic elements 22 in view of a normal direction of the first substrate 11. In another embodiment of the present disclosure, the via 131 may be partially or completely overlapped with the electronic module 2 or the first electronic elements 22 in view of the normal direction of the first substrate 11.

The electronic device illustrate in the above embodiments can be arranged in juxtaposition to form a tiled electronic system. Examples of the tiled electronic system of the present disclosure are illustrated in the following embodiments.

Embodiment 5

Figure 9:
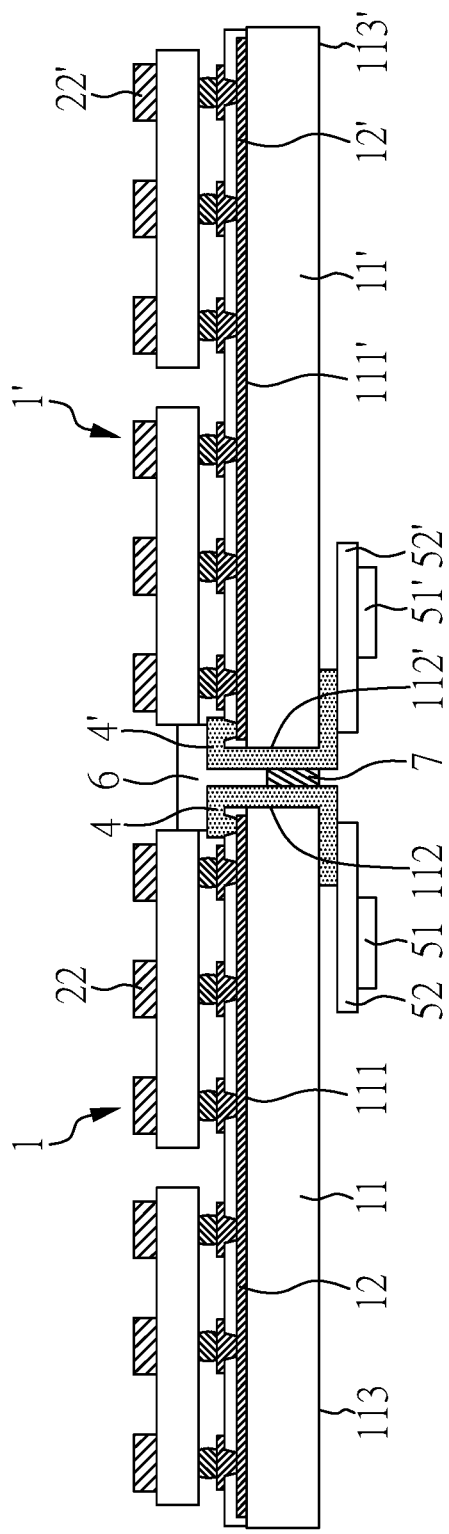
FIG. 9 is a cross-sectional view of a tiled electronic system according to Embodiment 5 of the present disclosure.

FIG. 9 is a cross-sectional view of a tiled electronic system of the present embodiment. The tiled electronic system of the present embodiment comprise: a first electronic device 1; and a second electronic device 1' disposed adjacent to the first electronic device 1. The first electronic device 1 is the same as the electronic device illustrated in Embodiment 1. The second electronic device 1' is similar to the electronic device illustrated in Embodiment 1 and comprises: a second substrate 11' having a second top surface 111' and a second side surface 112' connecting to the second top surface 111'; a second signal line 12' formed on the second top surface 111'; a plurality of second electronic elements 22' electrically connected to the second signal line 12'; and a second conductive pattern 4' formed on the second top surface 111' and the second side surface 112', and electrically connected to the second signal line 12'. Herein, the features such as the structures or the materials of the second electronic device 1' are similar to the electronic device illustrated in the above embodiments, and are not repeated again.

In the present embodiment, the first electronic device 1 and the second electronic device 1' are arranged in juxtaposition to form a tiled electronic system, wherein the first electronic device 1 is electrically connected to the second electronic device 1' through a connecting element 7. Herein, the connecting element 7 can be made of a conductive ink, a conductive paste, or an anisotropic conductive film (ACF), but the present disclosure is not limited thereto.

In the present embodiment, the first electronic device 1 further comprises a first circuit board 52 electrically connected to the first conductive pattern 4, and the second electronic device 1' further comprises a second circuit board 52' electrically connected to the second conductive pattern 4', and the connecting element 7 electrically connects the first circuit board 52 and the second circuit board 52'. In particular, the first conductive pattern 4 is further formed on a first bottom surface 113 opposite to a first top surface 111, and the first circuit board 52 is electrically connected to the first conductive pattern 4 at the first bottom surface 113. The second conductive pattern 4' is further formed on a second bottom surface 113' opposite to the second top surface 111', and the second circuit board 52' is electrically connected to the second conductive pattern 4' at the second bottom surface 113'. The connecting element 7 is disposed between the first conductive pattern 4 and the second conductive pattern 4'. In addition, the connecting element 7 is electrically connected to the first conductive pattern 4 and the second conductive pattern 4' to electrically connect the first circuit board 52 and the second circuit board 52'.

In addition, the tiled electronic system of the present embodiment may further comprise an intermediate element 6 disposed between the first electronic device 1 and the second electronic device 1'. More specifically, the intermediate element 6 is disposed between the first conductive pattern 4 and the second conductive pattern 4'. Herein, the intermediate element 6 can be an element with at least one of the functions of anti-reflection or fixing.

Embodiment 6

Figure 10:
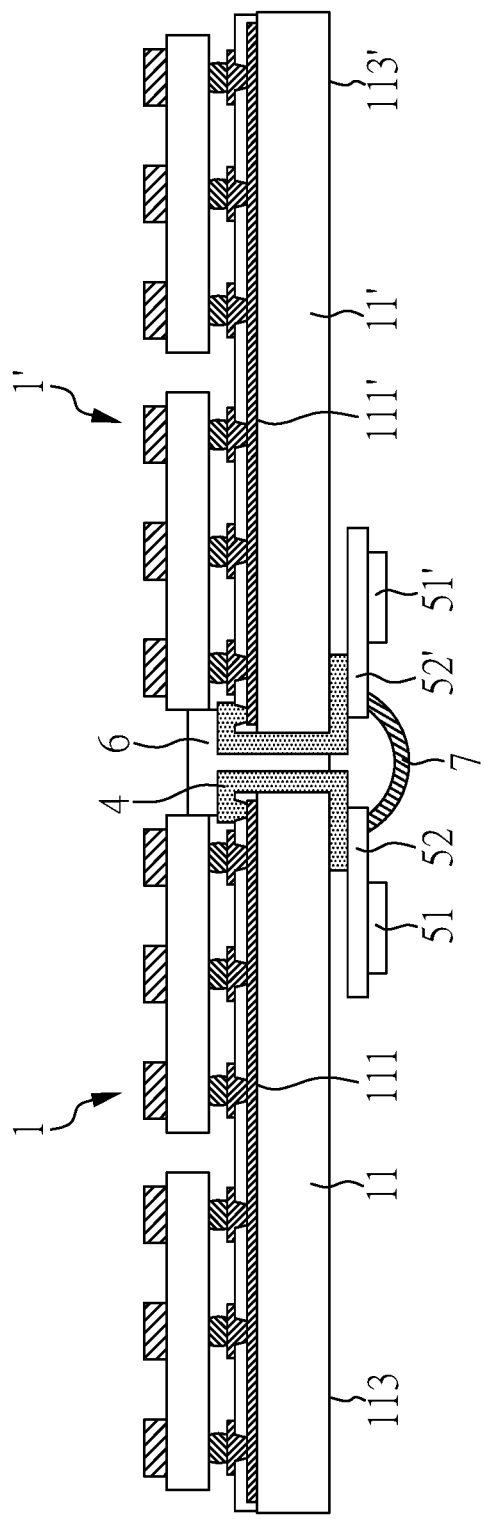
FIG. 10 is a cross-sectional view of a tiled electronic system according to Embodiment 6 of the present disclosure.

FIG. 10 is a cross-sectional view of an electronic device of the present embodiment. The electronic device of the present embodiment is similar to that shown in Embodiment 5, except for the following differences.

In the present embodiment, the connecting element 7 is not disposed between the first conductive pattern 4 and the second conductive pattern 4', but is disposed below the first substrate 11 and the second substrate 11'.

Embodiment 7

Figure 11:
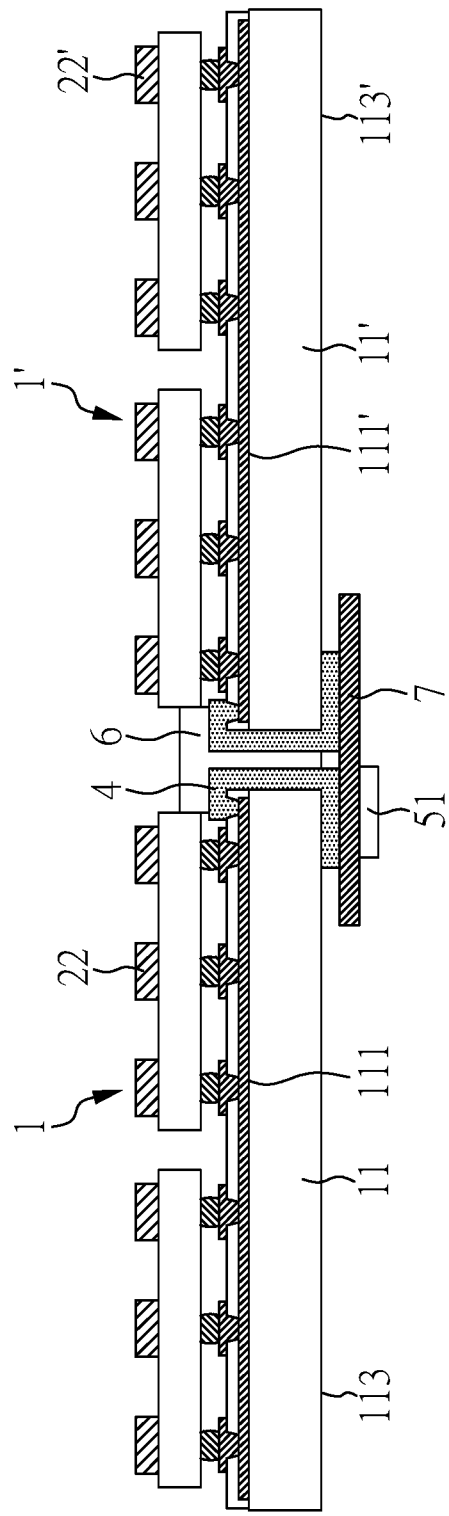
FIG. 11 is a cross-sectional view of a tiled electronic system according to Embodiment 7 of the present disclosure.

FIG. 11 is a cross-sectional view of an electronic device of the present embodiment. The electronic device of the present embodiment is similar to that shown in Embodiment 5, except for the following differences.

In the present embodiment, the connecting element 7 is not disposed between the first conductive pattern 4 and the second conductive pattern 4', but is disposed below the first substrate 11 and the second substrate 11'. In addition, the first electronic device 1 does not comprise the first circuit board 52 shown in FIG. 9, and the second electronic device 1' also does not comprise the second circuit board 52' shown in FIG. 9. A driving element 51 is electrically connected to the connecting element 7 electrically connected to the first conductive pattern 4 and the second conductive pattern 4'. Thus, the signal provided by the driving element 51 can be transmitted to the first conductive pattern 4 and the second conductive pattern 4' through the connecting element 7. Herein, the connecting element 7 can be, for example, a circuit board.

Embodiment 8

Figure 12:
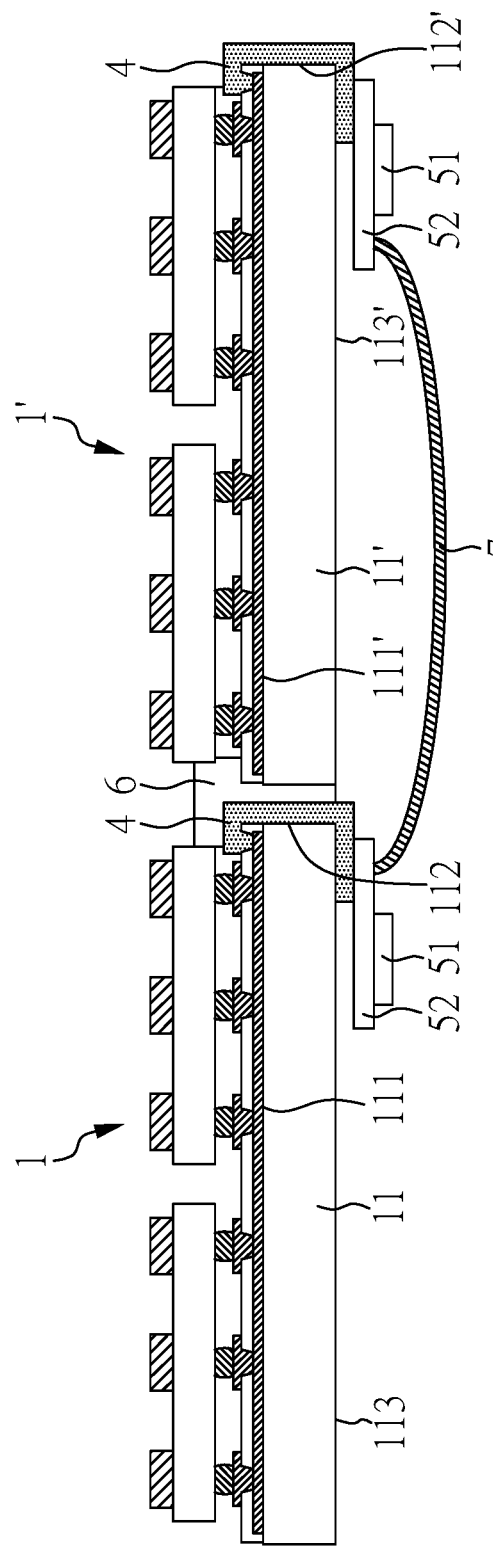
FIG. 12 is a cross-sectional view of a tiled electronic system according to Embodiment 8 of the present disclosure.

FIG. 12 is a cross-sectional view of an electronic device of the present embodiment. The electronic device of the present embodiment is similar to that shown in Embodiment 6, except for the following differences.

In Embodiment 6, the second side surface 112' that the second conductive pattern 4' disposed thereon is the surface closest to the first side surface 112 that the first conductive pattern 4 disposed thereon. In the present embodiment, the second side surface 112' that the second conductive pattern 4' disposed thereon is the surface farthest to the first side surface 112 that the first conductive pattern 4 disposed thereon.

In the above embodiments, the first electronic device 1 and the second electronic device 1' have almost the same structures. However, the present disclosure is not limited thereto. The first electronic device 1 and the second electronic device 1' can have different structures, as long as the first conductive pattern 4 is used to electrically connect the elements on the first top surface 111 and the first bottom surface 113 and/or the second conductive pattern 4' is used to electrically connect the elements on the second top surface 111' and the second bottom surface 113'. Herein, the connecting element 7 can be, for example, a wire or a flexible circuit board.

When the electronic device made as described in any of the embodiments of the present disclosure is a display device, the electronic device can be applied to any electronic devices that need a display screen, such as displays, mobile phones, laptops, video cameras, still cameras, music players, mobile navigators, TV sets, and other electronic devices that display images. When the tiled electronic system made as described in any of the embodiments of the present disclosure is a tiled display system, the tiled electronic system can be applied to any electronic devices that need to display large images, such as video walls, and advertising boards.

Although the present disclosure has been explained in relation to its embodiment, it is to be understood that many other possible modifications and variations can be made without departing from the spirit and scope of the disclosure as hereinafter claimed.

The invention claimed is:

1. An electronic device used for coupling to another electronic device in a side by side manner, comprising:
    a first substrate having a first top surface, a first bottom surface opposite to the first top surface and a first side surface connecting to the first top surface and the first bottom surface;
    a first signal line formed on the first top surface;
    a plurality of first electronic elements electrically connected to the first signal line;
    a first conductive pattern formed on the first top surface, the first bottom surface and the first side surface, and electrically connected to the first signal line;
    a first circuit board electrically connected to the first conductive pattern at the first bottom surface; and
    an insulating layer formed on the first signal line, wherein the first conductive pattern is electrically connected to the first signal line through a conductive element disposed in a via of the insulating layer;
    wherein the first conductive pattern at least covers a top surface of the insulating layer closing to the first side surface and a side surface of the insulating layer.

2. The electronic device of claim 1, wherein the first signal line comprises a pad, and the first conductive pattern is electrically connected to the pad through the via of the insulating layer.

3. The electronic device of claim 1, wherein the electronic device is a display device, a sensing device, an antenna device or a combination thereof.

4. The electronic device of claim 1, wherein each of the plurality of first electronic elements is respectively a light emitting diode, an antenna unit or a sensor.

5. The electronic device of claim 1, wherein the conductive element comprises one of Ag, Al, Ni, Cr, Au, Pd, Pt, Sn, W, Rh, Ir, Ru, Mg, Zn, Mo, W, Ti, an alloy thereof, or a combination thereof.

6. The electronic device of claim 2, wherein the first conductive pattern is at least partially overlapped with the pad of the first signal line in view of a normal direction of the first substrate.

7. The electronic device of claim 2, wherein the pad of the first signal line has a first width along a first direction, the first conductive pattern has a second width along the first direction, and the first width is greater than the second width.

8. The electronic device of claim 2, wherein the first conductive pattern has a second width along a first direction, the via has a third width along the first direction, and the second width is greater than the third width.

9. A tiled electronic system, comprising:
    a first electronic device, comprising:
        a first substrate having a first top surface and a first side surface connecting to the first top surface;
        a first signal line formed on the first top surface;
        a plurality of first electronic elements electrically connected to the first signal line;
        a first conductive pattern formed on the first top surface and the first side surface, and electrically connected to the first signal line; and
        an insulating layer formed on the first signal line, wherein the first conductive pattern is electrically connected to the first signal line through a conductive element disposed in a via of the insulating layer; and
    a second electronic device disposed adjacent to the first electronic device and comprising:

a second substrate having a second top surface and a second side surface connecting to the second top surface;

a second signal line formed on the second top surface;

a plurality of second electronic elements electrically connected to the second signal line; and a second conductive pattern formed on the second top surface and the second side surface, and electrically connected to the second signal line, wherein the first electronic device is electrically connected to the second electronic device through a connecting element;

wherein the first conductive pattern at least covers a top surface of the insulating layer closing to the first side surface and a side surface of the insulating layer.

10. The tiled electronic system of claim 9, wherein the connecting element is electrically connected to the first conductive pattern and the second conductive pattern.

11. The tiled electronic system of claim 9, wherein the first electronic device further comprises a first circuit board electrically connected to the first conductive pattern, and the second electronic device further comprises a second circuit board electrically connected to the second conductive pattern, and the connecting element electrically connects the first circuit board and the second circuit board.

12. The tiled electronic system of claim 9, further comprising an intermediate element disposed between the first electronic device and the second electronic device.

13. The tiled electronic system of claim 9, wherein the conductive element comprises one of Ag, Al, Ni, Cr, Au, Pd, Pt, Sn, W, Rh, Ir, Ru, Mg, Zn, Mo, W, Ti, an alloy thereof, or a combination thereof.

14. The tiled electronic system of claim 11, wherein the first substrate further has a first bottom surface opposite to the first top surface, the first conductive pattern is further formed on the first bottom surface, and the first circuit board is electrically connected to the first conductive pattern at the first bottom surface.

15. The tiled electronic system of claim 11, wherein the second substrate further has a second bottom surface opposite to the second top surface, the second conductive pattern is further formed on the second bottom surface, and the second circuit board is electrically connected to the second conductive pattern at the second bottom surface.

* * * * *